(12) United States Patent
Kuo et al.

(10) Patent No.: US 6,864,042 B1
(45) Date of Patent: Mar. 8, 2005

(54) PATTERNING LONGITUDINAL MAGNETIC RECORDING MEDIA WITH ION IMPLANTATION

(75) Inventors: David Kuo, Palo Alto, CA (US); Xinwei Li, Milpitas, CA (US); Jing Gui, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 93 days.

(21) Appl. No.: 09/912,065

(22) Filed: Jul. 25, 2001

Related U.S. Application Data

(60) Provisional application No. 60/221,260, filed on Jul. 25, 2000.

(51) Int. Cl.[7] .............................................. C23C 14/04
(52) U.S. Cl. ...................... 430/320; 430/322; 427/526; 427/523; 427/531; 427/128
(58) Field of Search ................................ 430/322, 320; 427/526, 523, 531, 128

(56) References Cited

U.S. PATENT DOCUMENTS

| | | | |
|---|---|---|---|
| 1,443,248 A | | 7/1923 | Sargunar |
| 3,967,002 A | | 6/1976 | Almasi et al. |
| 4,314,894 A | | 2/1982 | Schmelzer et al. |
| 4,556,597 A | | 12/1985 | Best et al. |
| 4,935,278 A | | 6/1990 | Krounbi et al. |
| 5,083,226 A | | 1/1992 | Shiiki et al. |
| 5,232,566 A | * | 8/1993 | Edmonson et al. ...... 204/192.1 |
| 5,858,474 A | | 1/1999 | Meyer et al. |
| 5,991,104 A | | 11/1999 | Bonyhard |
| 6,014,296 A | | 1/2000 | Ichihara et al. |
| 6,055,139 A | | 4/2000 | Ohtsuka et al. |
| 6,086,961 A | | 7/2000 | Bonyhard |
| 6,153,281 A | | 11/2000 | Meyer et al. |
| 6,156,422 A | | 12/2000 | Wu et al. |
| 6,383,574 B1 | * | 5/2002 | Han et al. ................... 427/526 |
| 6,510,015 B2 | * | 1/2003 | Sacks et al. .................. 360/75 |
| 2001/0033453 A1 | * | 10/2001 | Belser et al. ............. 360/77.03 |

FOREIGN PATENT DOCUMENTS

| | | | | |
|---|---|---|---|---|
| DE | | 271191 A | * 8/1989 | ........... C23C/14/48 |
| JP | | 03/105721 | 6/1987 | |
| JP | | 36-212802 | 6/1987 | |

OTHER PUBLICATIONS

Finn Jorgensen, The Complete Handbook of Magnetic Recording, Fourth Edition, 1996, Chapters 7, 9 and 16, McGraw–Hill, New York.

* cited by examiner

*Primary Examiner*—John A. McPherson
*Assistant Examiner*—Daborah Chacko-Davis
(74) *Attorney, Agent, or Firm*—McDermott Will & Emery LLP

(57) ABSTRACT

A magnetic recording medium is formed with a distribution of low coercivity regions functioning as a transition pattern for servo information capable of being sensed by a read/write head by exposing a masked magnetic layer to ions to change the coercivity of the exposed magnetic layer without substantially affecting the topography of the magnetic layer.

Embodiments of the present invention include forming a series of substantially radially extending low coercivity regions used to divide the magnetic layer into a plurality of sectors comprising substantially concentric circumferentially extending data tracks by exposing a masked magnetic layer having a high coercivity, i.e. from about 2000 Oe to about 10000 Oe, to one or more heavy atom ion bombardments of gaseous ions, e.g. argon ions, at a dose of about $1 \times 10^{13}$ atoms/cm$^2$ to about $9 \times 10^{15}$ atoms/cm$^2$ having an implantation energy of about 10 KeV to about 50 KeV.

14 Claims, 5 Drawing Sheets

PATTERNING LONGITUDINAL MAGNETIC RECORDING MEDIA WITH ION IMPLANTATION

CROSS REFERENCE TO RELATED APPLICATIONS

This application claims priority from provisional patent application Ser. No. 60/221,260, filed Jul. 25, 2000 entitled "PATTERNING LONGITUDINAL MAGNETIC RECORDING MEDIA WITH ION IMPLANTATIONS" the entire disclosure of which is incorporated herein by reference.

FIELD OF THE INVENTION

The present invention relates to magnetic recording media containing substantially radially distributed servo-marks and to a method for manufacturing the magnetic recording media. The present invention has particular applicability in forming servo-marks for use in high areal recording density magnetic recording media with increased data reading speed.

BACKGROUND ART

Thin film magnetic recording discs and disc drives are conventionally employed for storing large amounts of data in magnetizable form. In operation, a typical contact start/stop (CSS) method involves a floating transducer head gliding at a predetermined distance from the surface of the disc due to dynamic pressure effects caused by air flow generated between the sliding surfaces of the transducer head and the disc. During reading and recording (writing) operations, the transducer head is maintained at a controlled distance from the recording surface, supported on a bearing of air as the disc rotates, such that the transducer head can be freely moved in both the circumferential and radial directions, allowing data to be recorded on and retrieved from the surface of the disc at a desired position in a data zone.

In conventional hard disc drives, data are stored in terms of bits along tracks. In operation, the disc is rotated at relatively high speed, and the magnetic head assembly is mounted on the end of a support or actuator arm, which positions the head radially on the disc surface. If the actuator arm is held stationary, the magnetic head assembly will pass over a circular path on the disc, i.e. over a track, and information can be read from or written to that track. Each concentric track has a unique radius, and reading and writing information from or to a specific track requires the magnetic head to be located above the track. By moving the actuator arm, the magnetic head assembly is moved radially on the disc surface between tracks. Many actuator arms are rotary, wherein the magnetic head assembly is moved between tracks by activating a servomotor which pivots the actuator arm. A linear actuator may alternatively be used to move a magnetic head assembly inward or outward on the disc along a straight line.

To record information on the disc, the transducer creates a highly concentrated magnetic field in close proximity to the magnetic recording medium. During writing, the strength of the concentrated magnetic field directly under the write transducer is greater than the coercivity of the recording medium (known as "saturating" the medium), and grains of the recording medium at that location are magnetized with a direction which matches the direction of the applied magnetic field. The grains of the recording medium retain their magnetization after the saturating magnetic field is removed. As the disc rotates, the direction of the writing magnetic field is alternated based on bits of the information being stored, thereby recording a magnetic pattern on the track directly under the write transducer.

On each track, typically eight bits form a byte and bytes of data are grouped as sectors. Reading or writing a sector requires knowing the physical location of the data in the data zone so that the servo-controller of the disc drive can accurately position the read/write heads in the correct location at the correct time. Most disc drives use embedded "servo patterns" of recorded information on the disc. The servo patterns are read by the magnetic head assembly to inform the disc drive of track location. In conventional disc drives, tracks typically include both data sectors and servo patterns and each servo pattern typically includes radial indexing information, as well as a "servo burst". A servo burst is a centering pattern to precisely position the head over the center of the track. Because of the locational precision needed, writing of servo patterns requires expensive servo-pattern writing equipment and is a time consuming process.

Servo patterns are conventionally formed by a read-write head and opto-mechanical positioning device. An alternative approach to the servo-sensing problem comprises the use of mechanical voids or depressions in the magnetic layer between tracks formed by stamping or otherwise physically marking a pattern on the disc to function as servo patterns. A magnetic material layer is then applied at a consistent thickness over the entire disc surface. When this type of disc is used, the distance from the magnetic head to magnetic material in the depressions is further than the distance from the magnetic head to magnetic material in the track. The increased distance both reduces the strength of the signal recorded in the depressions and reduces the contribution from the depressions to the magnetic field sensed by the read head.

While the depressions or voids formed in the disc are helpful in increasing track density, they tend to reduce the tribological performance of the disc assembly. For example, during operation of the magnetic recording medium, the slider no longer travels over a smooth surface and thus causes several mechanical performance drawbacks. These drawbacks include modulation of fly height when encountering servo patterns, fly height perturbations due to topography changes from the track width definition, glide defects from the stamping process, and disc distortion due to the servo patterning process. It is preferred therefore to provide the servo pattern without surface topography.

Several approaches to forming servo-patterns are disclosed in the prior art. For example, U.S. Pat. No. 6,153,281 and U.S. Pat. No. 5,858,474, both to Meyer et al., disclose a magnetic medium having permanently defined boundaries between tracks and a consistent surface smoothness. Servo-patterns are formed, in part, by laser ablation, laser heating, photolithography, perpendicular deposition, ion milling, reverse sputtering, and ion implantation and can be used individually or in combination, with either the magnetic layer or underlayer, to create relatively non-magnetic areas. U.S. Pat. Nos. 6,086,961 and 5,991,104, both to Bonyhard, disclose creating non-magnetic areas in the formation of servo-sensing patterns by ion implantation where the ion implantation destroys the magnetic properties of the magnetic layer.

Still other art discloses methods for forming servo-patterns as U.S. Pat. No. 6,055,139 to Ohtsuka et al. where implanting chromium ions into a hard magnetic disc is used to change regions of the magnetic layer into non-magnetic regions. U.S. Pat. No. 4,556,597 to Best et al. discloses a magnetic recording disc substrate provided with a capacitive servo-pattern formed by implanting doped materials in the substrate to modify the substrate conductivity. Sargunar, in U.K. 1,443,248, discloses magnetic recording medium and methods for making the medium by forming low coercivity regions in the medium by implanting chromium ions. However, it is believed that the use of such metal ions adversely damages the magnetic layer.

Although the art has recognized forming servo-patterns and marks on magnetic medium without substantially altering the topography of the media, an additional need exists for increasing areal density, smoothness and throughput of magnetic recording media.

Thus, there exists a continuing need for magnetic recording media having servo-marks which occupy a reduced area of the media surface thereby increasing, available area for recording data. There also exists a need for an efficient, economical fabrication methodology enabling the recording of servo information on a magnetic medium without adversely affecting topography.

DISCLOSURE OF THE INVENTION

An advantage of the present invention is a magnetic recording medium having embedded servo-marks and increased areal recording density.

Another advantage of the present invention is a method of manufacturing a magnetic recording medium having topographically smooth servo information and increased areal recording density.

Additional advantages and other features of the invention will be set forth in the description which follows and in part will be apparent to those having ordinary skill in the art upon examination of the following or may be learned from the practice of the present invention. Advantages of the present invention may be realized and particularly pointed out in the appended claims.

According to the present invention, the foregoing and other advantages are achieved in part by a magnetic recording medium comprising: a magnetic layer having a substantially uniform surface containing a data zone and servo-information in the form of patterns. The servo-information comprises a distribution of high coercivity regions and a distribution of low coercivity regions that are capable of being sensed to enable positioning of a read/write head in the data zone, wherein the difference between the high coercivity regions and the low coercivity regions are from about 500 Oersted (Oe) to about 5000 Oe, e.g. about 800 Oe to about 2000 Oe.

Embodiments of the present invention include media where the servo-information comprises a series of regions extending in a radial direction across the data zone to divide the data zone into a plurality of sectors. The formed magnetic recording medium of the present invention allows reading from or writing on the magnetic recording medium by sensing, as by electrical means, one or more of the low coercivity regions making up the servo information on the magnetic recording medium; reading the magnetically recorded servo-information in a data track; and moving the read/write head to a particular position in the data zone in response to reading the servo-information.

A further aspect of the present invention is a method of patterning a magnetic layer having a high coercivity for the production of a magnetic recording medium. The method comprises exposing a selectively masked magnetic layer on a substrate to ions having an implantation energy of about 5 kiloelectron volts (KeV) to about 150 KeV to change the coercivity of the exposed magnetic layer without substantially affecting the topography of the magnetic layer to form a distribution of low coercivity regions functioning as servo-marks capable of being sensed by a read/write head. Advantageously, the present inventive patterning method allows the formation of servo information in a magnetic layer by creating low coercivity regions therein through ion implantation resulting in changing the coercivity of the exposed regions of the magnetic layer from about 500 Oe to about 5000 Oe.

Embodiments of the present invention include depositing a photoresist layer on the magnetic layer, selectively exposing the deposited photoresist layer to radiation or particle bombardment and developing the exposed photoresist to form the masked magnetic layer. In one aspect of the present invention, the ion-implanted masked magnetic layer forms a series of substantially radially extending, low coercivity regions used to divide the magnetic layer into a plurality of sectors comprising substantially concentric circumferentially extending data tracks. Advantageously, the low coercivity regions of the present invention can be formed by exposing a masked magnetic layer having a high initial coercivity, i.e. from about 2000 Oe to about 15,000 Oe, to one or more heavy atom ion bombardments of gaseous ions, e.g. argon ions, at a dose of about $1 \times 10^{13}$ atoms/cm$^2$ to about $9 \times 10^{15}$ atoms/cm$^2$ having an implantation energy of about 10 KeV to about 50 KeV. After exposing the masked magnetic layer, and forming the low coercivity regions, a strong magnetic field of about 4000 gauss to about 20,000 gauss can be applied by providing a unidirectional DC magnetic bias to the magnetic layer to align the direction of magnetization of each of the magnetic domains of the magnetic layer in one direction and then reduced to effect switching of the magnetization direction of the exposed regions.

Additional advantages and other features of the present invention will become readily apparent to those skilled in this art from the following the detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description should be regarded as: illustrative in nature, not as restrictive.

DESCRIPTION OF THE INVENTION

Figure 1:
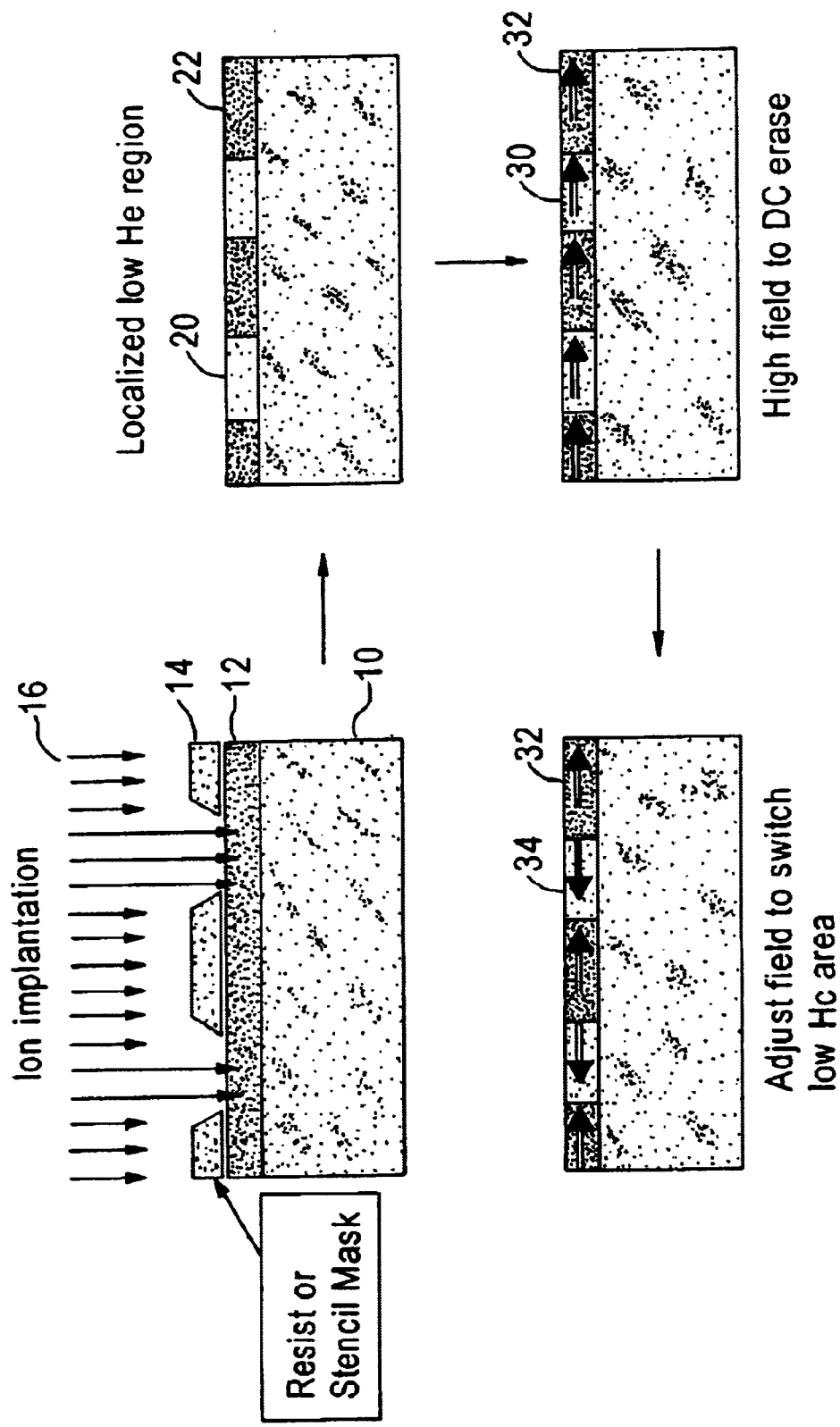
FIG. 1 schematically illustrates embodiments of forming low coercivity regions in a magnetic layer in accordance with the present invention.

Through study and experimentation, it has been discovered that low coercivity regions can be formed on a magnetic layer on a substrate by implanting ions having a particular energy and that the low coercivity regions can function as servo-marks that can be sensed with a read/write head. Although the prior art has employed ion implantation for various purposes, it is believed that the art has not recognized the benefit of the present invention.

In forming the magnetic layer of the present invention, a non-magnetic substrate is initially chosen, as known in the magnetic recording medium art or equivalence thereof. The surface of the non-magnetic substrate is polished, as by chemical-mechanical polishing and/or textured, to provide a substantially smooth surface without asperities to avoid interfering with the read/write head during operation. The non-magnetic substrates employed in embodiments of the present invention can be any of those employed in the manufacture of conventional magnetic recording media, including nickel-phosphorous plated aluminum and aluminum alloy substrates as well as alternative substrates such as glass, glass-ceramic, and ceramic materials.

In one embodiment of the present invention, an underlayer is deposited on either of the main surfaces of the substrate, as by conventional deposition techniques. In one aspect, the underlayer is formed of a relatively non-magnetic material such as chromium or nickel-phosphorous. The underlayer is used for influencing the crystallographic structure of the subsequently deposited magnetic layer.

Following the formation of the underlayer, a magnetic layer is formed on the surface of the underlayer on either side of the major surfaces of the underlayer, as by conventional magnetic layer forming techniques, such as by sputter deposition. In one aspect of the present invention, the magnetic layer comprises a cobalt-based alloy, such as a cobalt-chromium alloy and can further comprise several layers of cobalt alloys to form the magnetic layer. The magnetic layer can then be protected, as by depositing a protective overcoat, e.g. a carbon-containing layer, thereon through conventional deposition techniques.

In practicing the present invention, the formed magnetic layer is masked and then subject to ion bombardment, to change the coercivity of the exposed magnetic layer regions. In an embodiment of the present invention, the masked layer is subjected to heavy ions, i.e. where the ions have an atomic weight of greater than 35.

The present invention contemplates that the magnetic layer can be selectively masked prior to or after the formation of the protective overcoat, i.e. the magnetic layer has exposed regions or regions that are covered or otherwise protected by the photoresis. In an embodiment of the present invention the magnetic layer is masked with a photoresist that has been developed by e-beam lithography such that the openings within the mask ranges in size from about 10 nanometer to about 0.4 micron. Alternatively, the magnetic layer can be masked by depositing a conventional photoresist layer on the magnetic layer and exposing the deposited photoresist layer to image wise radiation to form a relief pattern therein and developing the exposed photoresist layer to form the mask magnetic layer. The present invention also contemplates imprinting the photoresist to form topographical features which provides differential stopping power due to thickness differences.

By exposing a masked magnetic layer having a high coercivity, e.g. from about 2000 Oe to about 15,000 Oe or any range therein, to ion bombardment, the present invention advantageously achieves a patterned magnetic layer having discrete low and high coercivity regions therein to function as servo-sensing information without adversely affecting the topography thereof. In a flow diagram illustrating an embodiment of the present invention, FIG. 1 shows magnetic layer 12 on substrate 10 and masked by resist or stencil 14, it being understood that the mask represents any desired pattern for coding servo information.

In accordance with the present invention, masked magnetic layer 12 is treated with ions 16. In an embodiment of the present invention, the ions are selected from the group consisting of helium, nitrogen, oxygen, argon, krypton, xenon, chromium or any subset thereof. In an embodiment of the present, invention, masked magnetic layer 12 is subjected to one or more ion bombardments of heavy ions at a dose of about $1 \times 10^{10}$ atoms/cm$^2$ to about $1 \times 10^{20}$ atoms/cm$^2$, e.g. of about $10^{12}$ atoms/cm$^2$ to about $10^{16}$ atoms/cm$^2$ and an implantation energy of about 5 KeV to about 150 KeV, e.g. of about 10 KeV to about 50 KeV to provide a low coercivity region in the exposed areas.

After ion bombardment, the mask, e.g. a photoresist, is removed to expose the magnetic layer having a discretely patterned low 20 and high 22 coercivity regions formed therein without adversely affecting the topography of the layer, as shown in FIG. 1b. In one aspect of the present invention, the photoresist is removed as by conventional photoresist removing techniques to form a magnetic layer having a plurality of low coercivity regions with no substantially significant topographical features. Advantageously, the ion bombardment in accordance with the present invention results in a magnetic layer having high uniformity across its surface. In an embodiment of the present invention, no topographical surface feature of the magnetic layer is greater than about 20 Å, e.g., the surface waviness of the magnetic layer does not vary by more than about 3–4 Å.

The present inventive patterning method allows the formation of servo information in a magnetic layer by creating a distribution of high coercivity regions and a distribution of low coercivity regions that are capable of being sensed to enable positioning of a read/write head in the data zone. Through ion implantation, the coercivity of the exposed magnetic layer can be altered from about 500 Oe to about 5000 Oe, or any range therein.

However, to enhance the detection of low coercivity regions, the present invention further contemplates switching the direction of magnetization of the low coercivity regions relative to the unexposed high coercivity regions of the magnetic layer. In practicing this embodiment of the present invention, the entire disc is magnetically initialized with a unidirectional high DC magnetic bias, as by a non-contact magnet having a magnetic flux higher than the highest coercivity region on the magnetic layer to be biased. FIG. 1 illustrates application of the unidirectional magnetic bias 30 and 32. After initialization, the low coercivity region is switched to a different direction 34, as by application of a lower DC magnetic bias field of reverse direction.

The resulting patterned magnetic layer produces a signal intensity provided by the servo patterns, i.e., between the relatively strong signal received from the high coercivity regions 32 and the weaker, switched signal received from the low coercivity regions 34, as shown in FIG. 1. The transition between high and low coercivity regions formed in accordance with embodiments of the present invention can be easily detected and are distinguishable from conventional magnetic data bits which are recorded and read by a magnetic/electrical techniques.

Embodiments of the present invention include forming ion implanted servo-sensing region capable of being electrically or magnetically sensed. The servo-marks or regions are formed at the beginning and at the end of magnetically recorded servo-information in substantially concentric, circumferentially extending data tracks. The servo-information enables accurate positioning of a read/write head in the data zone by the servo-controller of a conventional disc drive.

Figure 2:
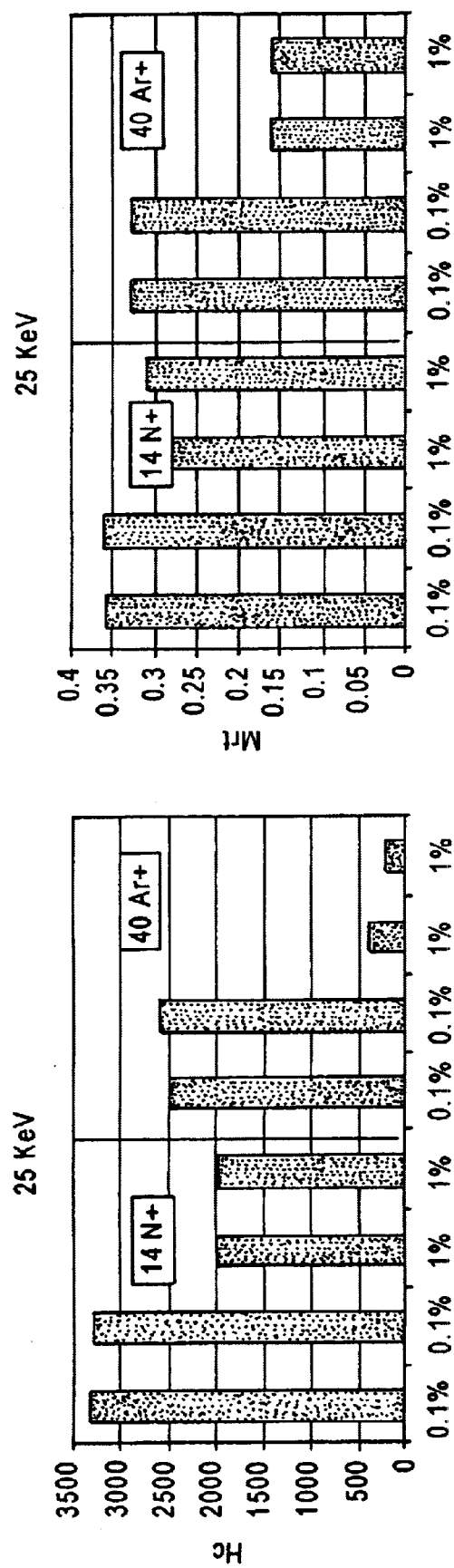
FIGS. 2 graphically illustrate the effect of ion implantation on magnetic coercivity in accordance with the present invention.
Figure 3:
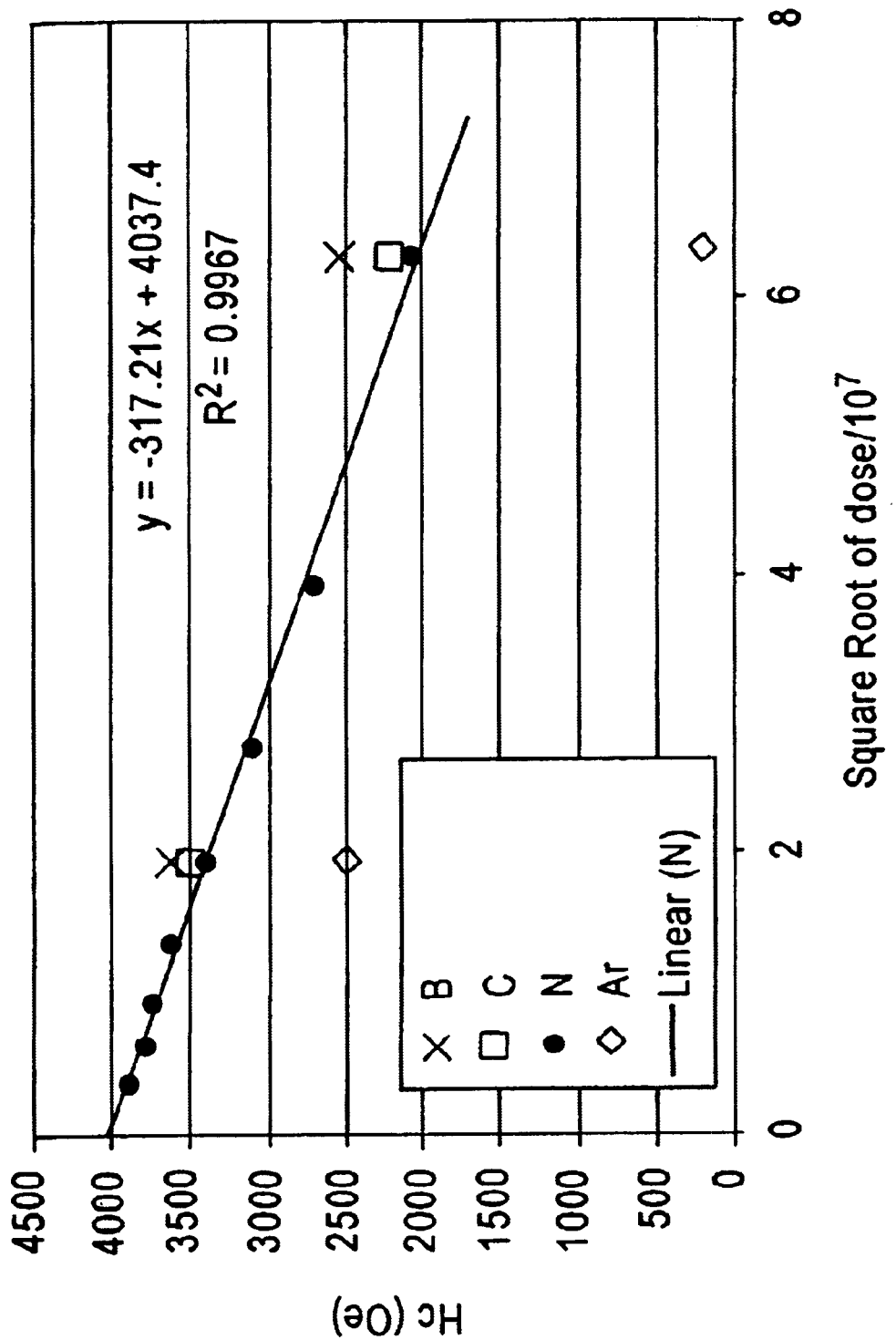
FIGS. 3 graphically illustrate the effect of dose and energy of ion implantation in accordance with the present invention.

A magnetic layer having a substantially uniform surface containing a data zone and servo-information comprising a distribution of high coercivity regions and a distribution of low coercivity regions that are capable of being sensed to enable positioning of a read/write head in the data zone is contemplated by the present invention. Upon experimentation it was observed that ion bombardment by heavy atoms advantageously achieves results that were unexpected in their affect of the magnetic layer. As shown in FIGS. 2 and 3, the ion bombardment of a heavy atom such as argon (atomic weight of about 40) significantly lowers the coercivity of a high coercivity magnetic layer in comparison to ion implantation of lighter ions, such as nitrogen ions (atomic weight of 14) at the same dose and energy. Further, ion implantation in accordance with the present invention does not completely eliminate the magnetism of the exposed regions thereby providing a low coercivity region that can be sensed and distinguished from other regions in the layer.

EXAMPLES

A series of longitudinal magnetic recording media were subjected to ion implantation at selected energies and dosages. The media comprised a substrate, a 600 Å NiAlT layer thereon, and a thin, e.g. 38 Å, CoMo seed layer on the nickel layer. A magnetic layer was deposited directly on the seed layer and comprised a CoCr layer, and two successive CoCrPtB layers thereon providing a total thickness of approximately 160 Å for the magnetic layers. Overlying the magnetic layer was an amorphous carbon overcoat of about 30 Å.

The magnetic layer had a coercivity of about 3950 Oe and an Mrt of about 0.4. FIG. 2 graphically illustrates the effect of implanting various dosages of either N+ or Ar+ions at 25 KeV through the carbon overcoat and through the magnetic layer. As shown, the coercivity was reduced from about 2500 Oe to as low as about 200 Oe and the Mrt was reduced from about 0.325 to about 0.17 with argon implantation. FIG. 3 graphically shows the effect on coercivity of the media by the coercively against the a variety of implanted ions as a function of dose. The experiments show that that argon ions significantly affected media properties at the same energy and dosage levels.

Figure 4:
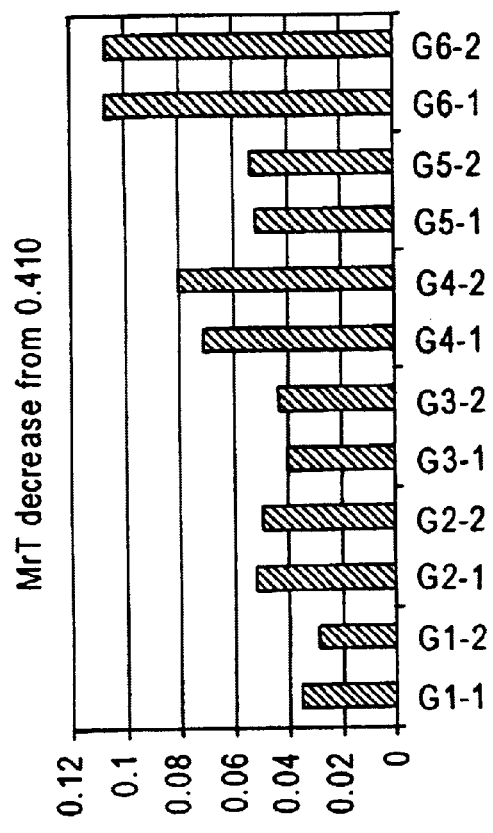
FIG. 4 graphically compares the relationship of ion species and dosage to coercivity.
Figure 4:
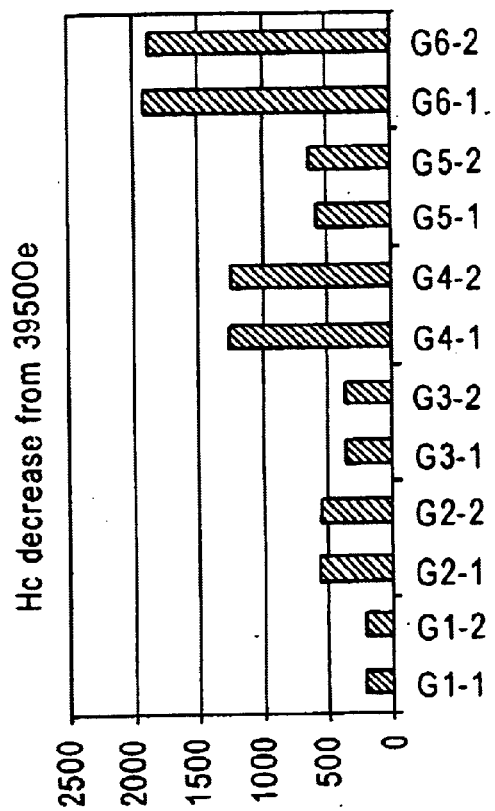
Figure 5:
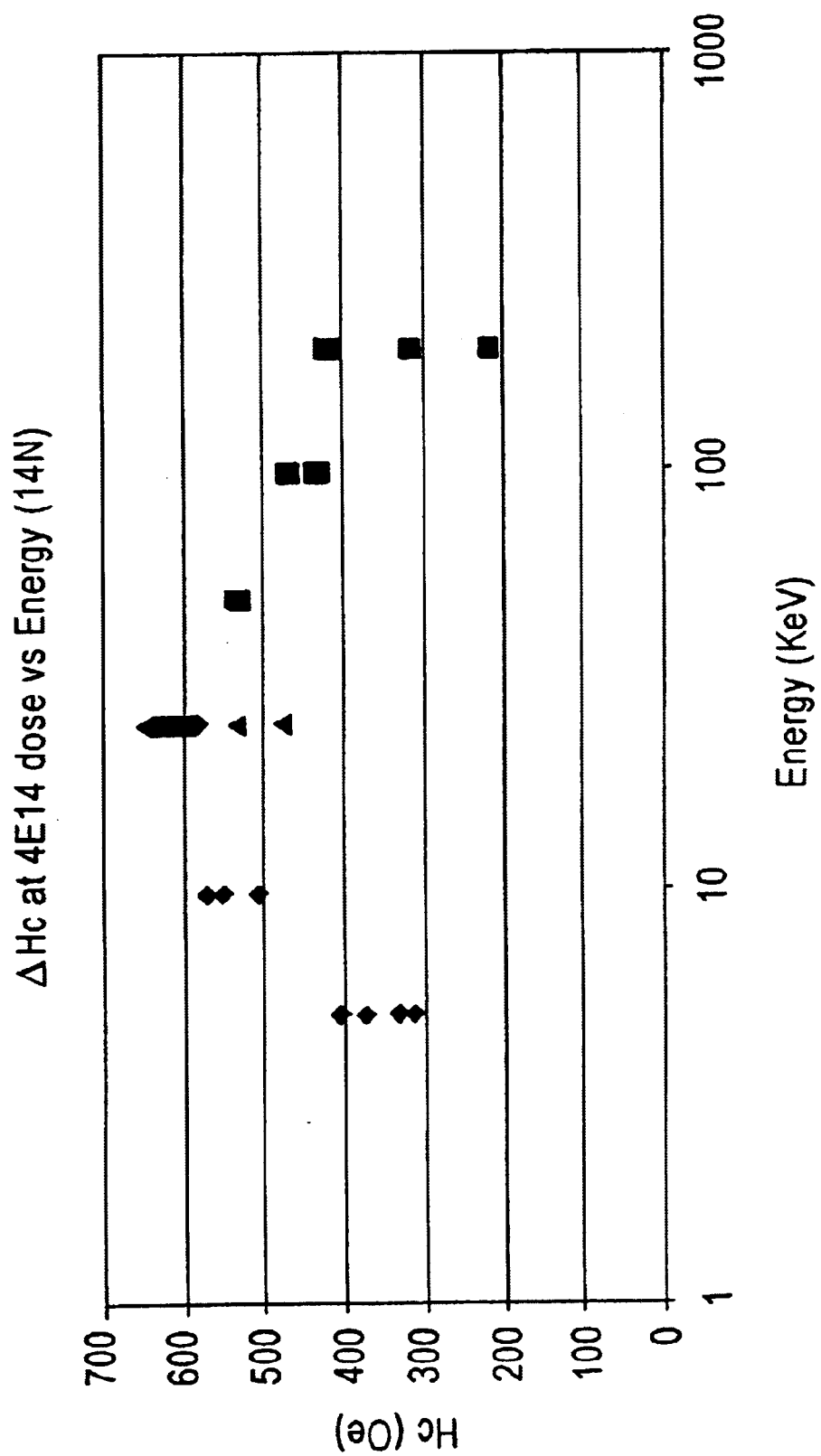
FIG. 5 shows the effect of ion beam irradiation energy on the change in the coercivity of the implanted regions.

It was further observed that at as the dosages and energy levels increased, the coercivity and Mrt of the media decreased accordingly. At even higher levels, it was observed that the reduction in coercivity becomes less as it is believed that most of the ion species at the higher energy levels simply passing through the magnetic layer with no effect. FIG. 4 shows the affect of ion implantation from an energy of from about 5 KeV to about 25 KeV and a dose of about $1\times10^{14}$ atom/cm$^2$ to about $40\times10^{14}$ atom/cm$^2$ on a series of media having an initial coercivity of 3950 Oe and Mrt of 0.41. FIG. 5 shows the effect of ion implantation at various energies between about 5 KeV to about 25 KeV and the effect on coercivity.

Advantageously, servo-marks in accordance with embodiments of the present invention can easily be detected to determine the beginning of magnetically recorded servo-information in the data tracks with respect to track location and data track position/alignment. Servo-marks are also formed to denote the end of such servo-information.

Upon detecting the transition patterns formed in accordance with embodiments of the present invention, the magnetically recorded servo-information is read and accurate positioning of a read/write head in the data zone can be implemented employing the servo-controller of a conventional hard drive, similar to conventional servo-feedback.

Magnetic layers deposited in accordance with the present invention can be any of those conventionally employed in the production of magnetic recording media, including cobalt alloys. Underlayers employed in the present invention can be any of those employed in manufacturing conventional magnetic recording media, such as chromium, chromium alloys, e.g., chromium-vanadium or chromium-titanium, oxygen-doped chromium, tungsten or a tungsten alloy. Protective overcoats employed in accordance with the present invention are those conventionally employed in manufacturing magnetic recording media, and typically contain carbon.

The present invention advantageously enables the formation of micromachined servo-pits having a reduced dimension to denote the beginning and end of magnetically recorded servo-information in data tracks thereby, conserving area in the data zone consistent with the current drive for magnetic recording media having increased areal recording density. The present invention can be employed to produce any of various types of magnetic recording media, including thin film discs, with an attendant increase in areal recording density, reduced servo-tracking area and increased data-reading speed.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A method of patterning a magnetic layer having a high coercivity for the production of a magnetic recording medium, the method comprising:

exposing a masked magnetic layer on a substrate to ions having an implantation energy of about 5 KeV to about 150 KeV to lower the coercivity of the exposed magnetic layer without substantially affecting the topography of the magnetic layer to form a distribution of low coercivity regions functioning as servo-marks capable of being sensed by a read/write head and forming a data zone in or on the magnetic layer for storing data.

2. The method according to claim 1, comprising:

exposing the masked magnetic layer to one or more ion bombardments at a dose of about $1\times10^{13}$ atoms/cm$^2$ to about $9\times10^{15}$ atoms/cm$^2$.

3. The method according to claim 2, comprising lowering the coercivity of the exposed magnetic layer by about 500 Oe to about 5000 Oe.

4. The method according to claim 1, comprising providing a unidirectional DC magnetic bias to the magnetic layer after exposing the masked magnetic layer to align the magnetization direction of each of the magnetic domains in one direction and then switching the magnetization direction of the exposed regions.

5. The method according to claim 1, comprising exposing the masked magnetic layer having a coercivity from about 2000 Oe to about 15000 Oe.

6. The method according to claim 1, comprising:
exposing the masked magnetic layer to one or more ions having an implantation energy of about 10 KeV to about 50 KeV.

7. The method according to claim 1, comprising exposing the masked magnetic layer to argon ions to lower the coercivity of the exposed magnetic layer.

8. The method according to claim 1, comprising exposing the masked magnetic layer to ions having a atomic weight of greater than about 35 to lower the coercivity of the exposed magnetic layer.

9. The method according to claim 1, comprising masking the magnetic layer to form a series of substantially radially extending low coercivity regions to divide the magnetic layer into a plurality of sectors comprising substantially concentric circumferentially extending data tracks.

10. The method according to claim 1, comprising:
depositing a photoresist layer on the magnetic layer, exposing the deposited photoresist layer to radiation and developing the exposed photoresist to form the masked magnetic layer.

11. The method according to claim 10, comprising removing the exposed photoresists after exposing the masked magnetic layer; and depositing a protective overcoat on the magnetic layer.

12. The method according to claim 1, comprising:
depositing a photoresist layer on the magnetic layer, and imprinting the photoresist layer with a stamper to form topography on the photoresist to form the masked magnetic layer.

13. The method according to claim 1, comprising:
depositing an underlayer on the substrate; and
depositing the magnetic layer on the underlayer.

14. The method according to claim 1, comprising:
exposing the masked magnetic layer on the substrate to one or more ion bombardments of ions at a dose of about $1 \times 10^{10}$ atoms/cm$^2$ to about $1 \times 10^{20}$ atoms/cm$^2$ and having an implantation energy of about 5 KeV to about 150 KeV, to provide the low coercivity region that differs from the high, unexposed regions by about 800 Oe to about 2000 Oe without substantially affecting the topography of the magnetic layer to form the distribution of low coercivity regions functioning as servo-marks capable of being sensed by a read/write head; and providing a unidirectional DC magnetic bias to the magnetic layer to align the magnetic flux of the magnetic layer in one direction and then switching the flux direction of the exposed regions.

* * * * *